(12) United States Patent
Niboshi (10) Patent No.: US 8,723,415 B2
(45) Date of Patent: May 13, 2014

(54) MOISTURE-PROOF FILM, METHOD FOR MANUFACTURING THE SAME, AND ORGANIC ELECTRONIC DEVICE INCLUDING THE SAME

(75) Inventor: Manabu Niboshi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 51 days.

(21) Appl. No.: 13/515,272

(22) PCT Filed: Dec. 9, 2010

(86) PCT No.: PCT/JP2010/007173
§ 371 (c)(1),
(2), (4) Date: Jun. 11, 2012

(87) PCT Pub. No.: WO2011/074214
PCT Pub. Date: Jun. 23, 2011

(65) Prior Publication Data
US 2012/0248975 A1    Oct. 4, 2012

(30) Foreign Application Priority Data
Dec. 14, 2009 (JP) ................. 2009-283163

(51) Int. Cl.
*H05B 33/04* (2006.01)
(52) U.S. Cl.
USPC .............................. 313/504; 428/218; 428/578
(58) Field of Classification Search
None
See application file for complete search history.

(56) References Cited

U.S. PATENT DOCUMENTS

| | | | |
|---|---|---|---|
| 6,198,215 B1 * | 3/2001 | Niboshi et al. | 313/503 |
| 2008/0038565 A1 | 2/2008 | Komada et al. | |
| 2009/0208715 A1 | 8/2009 | Stowell et al. | |
| 2012/0080671 A1 * | 4/2012 | Niboshi et al. | 257/40 |

FOREIGN PATENT DOCUMENTS

| | | |
|---|---|---|
| EP | 1489890 A1 | 12/2004 |
| EP | 1792726 A1 | 6/2007 |
| JP | 2004-66730 A | 3/2004 |
| JP | 2004-276564 A | 10/2004 |
| JP | 2005-169996 A | 6/2005 |
| JP | 2006-297730 A | 11/2006 |
| JP | 2007-7928 A | 1/2007 |
| JP | 2008-62498 A | 3/2008 |
| JP | 2009-95989 A | 5/2009 |

OTHER PUBLICATIONS

International Search Report received for PCT Patent Application No. PCT/JP2010/007173, mailed on Feb. 15, 2011, 5 pages (2 pages of English Translation and 3 pages of PCT Search Report).

* cited by examiner

*Primary Examiner* — Ashok Patel
(74) *Attorney, Agent, or Firm* — Morrison & Foerster LLP (57) ABSTRACT

A moisture-proof film (10) includes a moisture-proof part (12) formed on a surface of a film body (11). The moisture-proof part (12) includes a first layer made of a silicon oxycarbonitride compound containing carbon atoms in a composition thereof, and a second layer made of a silicon oxynitride compound which, in a composition thereof, contains carbon atoms less than those of the first layer or does not contain carbon atoms, and having a density higher than that of the first layer. The first and second layers are stacked adjoining each other. The first layer has a density increasing toward the second layer.

15 Claims, 6 Drawing Sheets

MOISTURE-PROOF FILM, METHOD FOR MANUFACTURING THE SAME, AND ORGANIC ELECTRONIC DEVICE INCLUDING THE SAME

CROSS REFERENCE TO RELATED APPLICATIONS

This is a U.S. National Phase patent application of PCT/JP2010/007173, filed Dec. 9, 2010, which claims priority to Japanese Patent Application No. 2009-283163, filed Dec. 14, 2009, each of which is hereby incorporated by reference in the present disclosure in its entirety.

TECHNICAL FIELD

The present invention relates to a moisture-proof film having excellent moisture-proof properties, a method for manufacturing the moisture-proof film, and an organic electronic device including the moisture-proof film.

BACKGROUND ART

As a film for packaging, e.g., food, medical products, or industrial products, a moisture-proof film has been known, in which a moisture-proof part made of, e.g., silicon oxide or aluminum oxide is formed on a film body made of resin. In recent years, increasing attention has been drawn to the moisture-proof film used for other purposes such as a support base of an electronic device, e.g., liquid crystal display devices, organic EL devices, solar batteries, and touch panels.

Patent Document 1 discloses a configuration of a moisture-proof film in which a stack of an inorganic oxide layer and a silicon oxycarbonitride layer is provided on at least one of surfaces of a base film, and also discloses that excellent moisture-heat resistance can be obtained by such a configuration.

CITATION LIST

Patent Document

PATENT DOCUMENT 1: Japanese Patent Publication No. 2006-297730

SUMMARY OF THE INVENTION

Technical Problem

However, the moisture-proof film having the configuration described in Patent Document 1 has a limit of about 0.1 g/m²·day to which a water vapor transmission rate can be suppressed. This is because of the following reason. Since a great change in density and composition occurs at an interface between the inorganic oxide layer and the silicon oxycarbonitride layer, dangling bonds of composition elements react with impurity gas containing hydrogen atoms or capture (trap) moisture. As a result, it becomes evitable that the moisture-proof film contains a certain amount of moisture.

In the case where the moisture-proof film is used as a support base of an organic electronic device such as organic EL display devices and organic thin film solar batteries, higher moisture-proof performance is required because functional properties are likely to be degraded due to damage of the organic electronic device caused by moisture.

It is an objective of the present invention to provide a moisture-proof film which can be used as a support base of, e.g., an organic electronic device and has excellent moisture-proof performance.

Solution to the Problem

A moisture-proof film of the present invention includes a film body and a moisture-proof part formed on a surface of the film body. The moisture-proof part includes a first layer made of a silicon oxycarbonitride compound containing carbon atoms in a composition thereof, and a second layer made of a silicon oxynitride compound which, in a composition thereof, contains carbon atoms less than those of the first layer or does not contain carbon atoms, and having a density higher than that of the first layer. The first and second layers are stacked adjoining each other. The first layer has a density increasing toward the second layer.

According to the foregoing configuration, since the first layer has the density increasing toward the second layer, a great change in density does not occur even at an interface between the first and second layers having different compositions. Thus, the number of dangling bonds is decreased as compared to that at an interface at which densities are significantly different from each other, and therefore it is less likely to capture moisture. As a result, high moisture-proof performance can be exhibited.

In the moisture-proof film of the present invention, the composition of the first layer may be represented by SiONC, and the composition of the second layer may be represented by SiON.

In the moisture-proof film of the present invention, the moisture-proof part is preferably formed by alternately stacking the first and second layers.

In the moisture-proof film of the present invention, the second layer may define an outermost surface of the moisture-proof part on a side closer to the film body.

In the moisture-proof film of the present invention, the second layer may define an outermost surface of the moisture-proof part on a side opposite to the film body.

In the moisture-proof film of the present invention, the moisture-proof part preferably have a thickness of 1-50 μm.

In the moisture-proof film of the present invention, the first layer may have a thickness of 0.5-50 μm.

In the moisture-proof film of the present invention, the second layer may have a thickness of 10-500 nm.

In the moisture-proof film of the present invention, the first layer may have a carbon content of 1-30 mol % measured by electron spectroscopy.

In the moisture-proof film of the present invention, the second layer may have a carbon content of 0-1 mol % measured by electron spectroscopy.

In the moisture-proof film of the present invention, the first layer may have a density of 2.3-2.6 g/cm³.

In the moisture-proof film of the present invention, the second layer may have a density of 2.8-3.1 g/cm³.

An organic electronic device of the present invention includes the moisture-proof film of the present invention; and an organic layer provided on the moisture-proof part of the moisture-proof film and provided so as to be sandwiched between two electrodes.

Since the organic electronic device having the foregoing configuration includes the moisture-proof film of the present invention, moisture can be prevented from entering the moisture-proof film from outside. As a result, degradation of functional properties of the organic electronic device due to moisture reaching the organic layer or the electrode can be reduced.

The organic electronic device of the present invention may be an organic electroluminescence display in which an organic layer is an organic electroluminescence layer.

A method for manufacturing the moisture-proof film of the present invention includes the steps of forming the first layer by using plasma chemical vapor deposition; and forming the second layer by using sputtering. In the forming the first layer, plasma irradiation intensity is stepwisely changed for forming part of the first layer closer to the second layer, thereby forming the first layer such that a density of the first layer is increased toward the second layer.

Advantages of the Invention

The moisture-proof film of the present invention includes the moisture-proof part having the first layer made of the silicon oxycarbonitride compound containing carbon atoms in the composition thereof, and the second layer made of the silicon oxynitride compound which, in the composition thereof, contains carbon atoms less than those of the first layer or does not contain carbon atoms, and having the density higher than that of the first layer. The first and second layers are stacked adjoining each other. The first layer has the density increasing toward the second layer. Thus, a great change in density does not occur even at the interface between the first and second layers having different compositions. Thus, the number of dangling bonds is decreased as compared to that at the interface at which the densities are significantly different from each other, and therefore it is less likely to capture moisture. As a result, the high moisture-proof performance can be exhibited.

DESCRIPTION OF EMBODIMENTS

An embodiment of the present invention will be described below in detail with reference to drawings.

(Organic EL Display Device)

Figure 1:
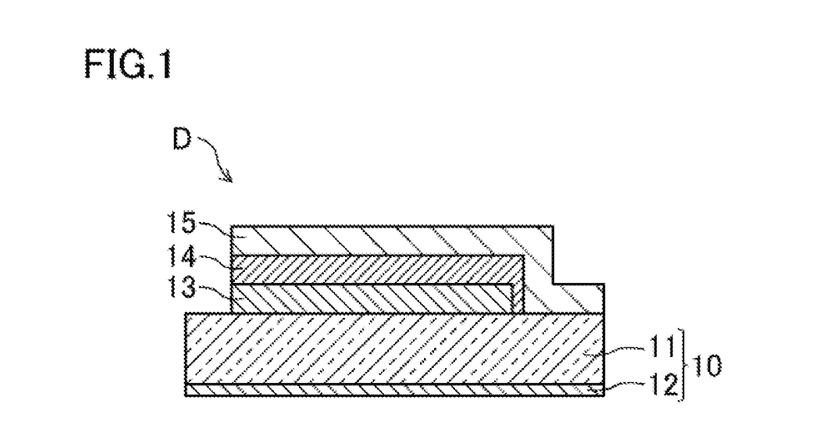
FIG. 1 is a cross-sectional view of an organic EL display device of an embodiment.

FIG. 1 illustrates an organic EL display device D of the present embodiment. The organic EL display device D is used as, e.g., a display of a mobile phone, a car navigation system, or a color television.

The organic EL display device D has a structure in which an organic EL element is provided on a support base 10.

The support base 10 is a moisture-proof film in which a moisture-proof part 12 is formed on a surface of a film body 11. The support base 10 has, e.g., a thickness of 10-300 µm, a vertical length of 50-300 mm, and a horizontal length of 50-300 mm.

The film body 11 of the moisture-proof film (support base) 10 is, e.g., a polyethylene terephthalate (PET) resin film, a polyethylene naphthalate (PEN) resin film, a cycloolefin (COP) resin film, a polyether sulfone (PES) resin film, a transparent and colorless polyimide (PI) film, or a triacetylcellulose (TAC) film. The film body 11 has, e.g., a thickness of 10-300 µm.

The moisture-proof part 12 is formed of a plurality of layers stacked in tiers. The plurality of layers forming the moisture-proof part 12 include a first layer made of a silicon oxycarbonitride compound which, in a composition thereof, contains carbon atoms, and a second layer made of a silicon oxynitride compound which, in a composition thereof, contains carbon atoms less than those of the first layer or does not contain carbon atoms.

The moisture-proof part 12 is formed by alternately stacking the first layer(s) and the second layer(s). The first layer(s) and the second layer(s) are preferably stacked such that the thickness of the moisture-proof part 12 is about 1-50 µm, and, e.g., four first layers and four second layers are alternately stacked one by one.

The moisture-proof part 12 may be formed of a single first layer and a single second layer. Alternatively, the moisture-proof part 12 may be formed of the odd number of layers as in, e.g., the case where the moisture-proof part 12 is formed by stacking a second layer, a first layer, a second layer, a first layer, and a second layer in this order, or may be formed of the even number of layers as in, e.g., the case where the moisture-proof part 12 is formed by stacking a second layer, a first layer, a second layer, a first layer, a second layer, and a first layer in this order. As another alternative, the moisture-proof part 12 may be formed such that first layers or second layers are successively stacked as in, e.g., the case where the moisture-proof part 12 is formed by stacking a second layer, a first layer, a first layer, and a second layer in this order. As still another alternative, the moisture-proof part 12 may include a third layer other than the first layer and the second layer.

The first layer is made of, e.g., a silicon oxycarbonitride compound represented by SiONC in a composition of which carbon is incorporated into an intermediate formed from $SiO_2$ and $Si_3N_4$. The material forming the first layer preferably has, e.g., a carbon content of 1-30 mol % and more preferably 1-10 mol %. Note that the carbon content of the first layer can be measured on the order of 0.1 mol % to several mol % by electron spectroscopy such as electron spectroscopy for chemical analysis (ESCA) or electron probe micro-analysis (EPMA) using an X-ray microanalyzer. The first layer preferably has, e.g., a thickness of 0.5-50 µm. The first layer is formed so as to have a thickness of equal to or greater than 1 µm, thereby ensuring moisture-proof performance of the moisture-proof part 12.

Since the first layer has the carbon content greater than that of the second layer, the first layer has a density lower than that of the second layer. The density is not uniform across the first layer, and the first layer has a density distribution in which the density increases toward the second layer having a density higher than that of the first layer. For example, if the second layer is positioned only on an upper side of the first layer, the density of the first layer increases from a lower side toward the upper side of the first layer. If the second layers are respectively positioned on both sides of the first layer, the density of the first layer decreases from the lower side toward the center of the first layer and increases from the center toward the upper side of the first layer. If the second layer is positioned only on the lower side of the first layer, the density of the first layer decreases from the lower side toward the upper side of the first layer. Since the first layer is configured such that the density thereof is not uniform across the first layer but increases toward the second layer as described above, a great change in density does not occur at an interface between the first layer and the second layer. A low-density part of the first layer has, e.g., a density of 2.3-2.6 g/cm$^3$, and a high-density part of the first layer closer to the second layer has, e.g., a density of 2.6-3.0 g/cm$^3$. Note that the layer density can be calculated based on results of X-ray intensity profiling measured by an X-ray reflectometer (XRR). In addition, the density distribution can be estimated based on a change in each film formation condition.

The second layer is made of, e.g., a silicon oxynitride compound having a composition represented by SiON. The material forming the second layer has a carbon content lower than that of the first layer. The carbon content of the second layer is equal to or less than 1 mol %, and it is preferable that the second layer does not contain carbon. The second layer has greater film stress because of the density thereof higher than that of the first layer, and is likely to be separated from the first layer when the second layers has a large thickness. Thus, the thickness of the second layer is preferably, e.g., 10-500 nm.

The second layer has the density higher than that of the first layer, and the density thereof is, e.g., 2.8-3.1 g/cm$^3$. Although the density of the second layer is not necessarily uniform across the entirety of the second layer, the second layer is not formed so as to have a density distribution similar to that of the first layer.

The first layer or the second layer of the moisture-proof part 12 may be outermost on a side closer to the film body 11. However, it is preferable that the second layer is outermost on the side closer to the film body 11 in order to increase adhesion strength to the film body 11.

The first layer or the second layer of the moisture-proof part 12 may be outermost on a side opposite to the film body 11. However, it is preferable that the second layer having a higher density is outermost on the side opposite to the film body 11 in order to ensure the strength of the moisture-proof film 10 at a surface thereof. In addition, it is preferable that the second layer made of an organic compound is outermost on the side opposite to the film body 11 considering compatibility with a material (e.g., an ITO electrode) formed on the surface of the moisture-proof film 10.

According to the moisture-proof film 10 having the foregoing configuration, since the first layer has the density increasing toward the second layer, a great change in density does not occur at the interface between the first layer and the second layer which have different compositions. Thus, the number of dangling bonds is decreased as compared to the case where a great change in density occurs at the interface between the first layer and the second layer. The larger number of dangling bonds at the interface results in capturing (trapping) of more moisture, and the captured moisture passes through pinholes formed in the moisture-proof part 12 and permeates the moisture-proof part 12. However, since the moisture-proof film 10 having the foregoing configuration has the small number of dangling bonds at the interface in the moisture-proof part 12, the excellent moisture-proof performance can be exhibited.

Figure 10:
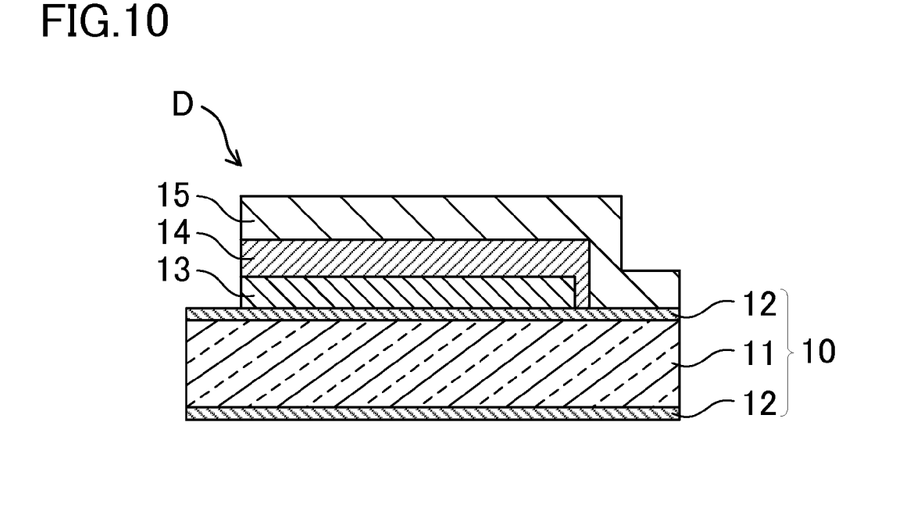
FIG. 10 is a cross-sectional view of an organic EL display device of an additional embodiment.

Although it has been described that the moisture-proof part 12 is formed on one of the surfaces of the film body 11, the moisture-proof part 12 may be formed on each of the surfaces of the film body 11(see FIG. 10).

The organic EL element has a structure in which a first electrode 13, an organic layer 14, and a second electrode 15 which are formed by performing pattern formation are stacked in this order on the surface of the support base.

The first electrode 13 is made of a conductive material and is provided corresponding to each of pixels on the support base. The first electrode 13 has a function to inject holes (positive holes) into the organic layer 14. The first electrode 13 is made of a conductive material such as indium tin oxide (ITO) or indium zinc oxide (IZO). The first electrode 13 has, e.g., a thickness of 50-150 nm.

The organic layer 14 has a structure in which a positive hole injection layer, a positive hole transporting layer, a light emitting layer, an electron transporting layer, and an electron injection layer are stacked in this order from a side closer to the first electrode 13. Note that the positive hole injection layer, the positive hole transporting layer, the electron transporting layer, and the electron injection layer are not essential, and such layers are formed as necessary.

The positive hole injection layer has a function to enhance efficiency of injecting positive holes to the light emitting layer, and the positive hole transporting layer has a function to enhance efficiency of transporting positive holes to the light emitting layer. For example, copper phthalocyanine (CuPc) or 4,4'-Bis[N-(1-naphtyl)-N-phenylamino]biphenyl (α-NPD) may be used as the material of the positive hole injection layer and the positive hole transporting layer. The positive hole injection layer and the positive hole transporting layer may be separately formed or may be integrally formed. In the latter case, the total thickness of the positive hole injection layer and the positive hole transporting layer is, e.g., 10-100 nm.

The light emitting layer has a function to emit light by recombining holes (positive holes) injected from the first electrode 13 with electrons injected from the second electrode 15. A material having high light emitting efficiency, such as a carbazole derivative of 4,4'-Bis(carbazole-9-yl)-biphenyl (CBP) or a triazole derivative of 2,4-triazole (TAZ), may be used as the material of the light emitting layer. The light emitting layer has, e.g., a thickness of 30-100 nm.

The electron transporting layer has a function to enhance efficiency of transporting electrons from the second electrode 15 to the light emitting layer, and the electron injection layer has a function to enhance efficiency of injecting electrons from the second electrode 15 to the light emitting layer. For example, Tris(8-quinolinyloxy) aluminum (Alq3) or 3-phenyl-4-(1'-naphthyl)-phenyl-5-phenyl-1,2,4-triazole (TAZ) may be used as the material of the electron transporting layer and the electron injection layer. The electron transporting layer and the electron injection layer may be separately formed or may be integrally formed. In the latter case, the total thickness of the electron transporting layer and the electron injection layer is, e.g., 10-100 nm.

The second electrode 15 has a function to inject electrons to the organic layer 14. For example, a magnesium alloy (e.g., MgAg) or an aluminum alloy (e.g., AlLi, AlCa, or AlMg) may be used as the material of the second electrode 15. The second electrode 15 has, e.g., a thickness of 50-100 nm.

A protective film (not shown in the figure) may be formed so as to cover the second electrode 15. The protective film is made of an insulating or conductive material and has, e.g., a thickness of 100-1000 nm. The protective film has a function to prevent water or oxygen from entering the organic layer 14.

Note that the organic EL element provided on the support base 10 is sealed by a sealing base material (not shown in the figure) in inert gas atmosphere.

In the organic EL display device D having the foregoing configuration, a predetermined image is displayed using all of the pixels by the following steps. When a TFT is turned on in each of the pixels, holes (positive holes) are injected from the first electrode 13 to the organic layer 14, and electrons are injected from the second electrode 15 to the organic layer 14. Then, the holes and the electrons are recombined with each other in the light emitting layer, and a light emitting material of the light emitting layer is excited by energy released by the recombination. The excited light emitting material emits fluorescent light or phosphorescent light when returning to a ground state from an excited state, and such fluorescent light or phosphorescent light is output to outside as light emitted from the organic layer 14. In the foregoing manner, the predetermined image is displayed using all of the pixels.

In the organic EL display device D having the foregoing configuration, since the moisture-proof film used as the support base 10 has the excellent moisture-proof performance, the amount of moisture entering a space sealed by the moisture-proof film 10 and sealing glass is reduced. As a result, damage of the electrode or the organic layer 14 due to the moisture is reduced, thereby obtaining excellent light emitting properties.

In the present embodiment, the first electrode 13 serves as an anode electrode, and the second electrode 15 serves as a cathode electrode. However, the organic EL element may have an inverted structure in which a first electrode serves as a cathode electrode and a second electrode serves as an anode electrode. In such a case, electrons are injected from the first electrode to the organic layer 14, and holes are injected from the second electrode to the organic layer 14. Then, the electrons and the holes are recombined with each other, and the organic layer 14 emits light. In such a manner, a predetermined image is displayed using all of the pixels.

In the present embodiment, the bottom emission type structure in which light exits from a side closer to the support base 10 is employed. However, a top emission type structure in which light exits from a side opposite to a support base may be employed. In such a case, a first electrode may be made of a reflective material such as aluminum or a silver alloy (e.g., APC), and a second electrode may be made of a light transmissive material having, e.g., a thickness of 10-30 nm.

(Method for Manufacturing Moisture-Proof Film)

Next, a method for manufacturing a moisture-proof film 10 will be described.

First, a CVD device including a reaction chamber and a deposition chamber is prepared, and a first layer is formed on a surface of a film body 11 by plasma CVD. At this point, the film body 11 is placed in a predetermined position of the deposition chamber. In addition, an inside of the deposition chamber is adjusted to be in atmosphere having pressure of about $10^{-3}$ Pa.

Subsequently, hexamethyldisilazane (HMDS) is used as raw material gas and is decomposed by heat of, e.g., 75-125° C. in the reaction chamber.

Next, the gas obtained by the heat decomposition is introduced into the deposition chamber. At this point, a gas flow rate is controlled to, e.g., 1-20 cm$^3$/min by a mass flow controller. Then, while supplying, e.g., Ar gas of about 10 cm$^3$/min and O$^2$ gas of about 5 cm$^3$/min to the deposition chamber, gas plasma is generated at an output of, e.g., 200 W by using a high frequency power supply, and a process for forming a SiONC film is performed for about 10 minutes or more. At this point, the film body 11 is heated to, e.g., equal to or higher than 100° C., thereby preventing the presence of moisture in the film during the film formation process.

After the film formation process is performed at the plasma output of 200 W for about 10 minutes, the plasma output is stepwisely increased to increase the density of the film which is being formed. At this point, the plasma output is increased by, e.g., 100 W at every one-minute step, and, when the plasma output reaches about 1 kW, the film formation process is performed for about 2 minutes in such a state. As this point, the first layer is formed.

Although it has been described that the plasma output is changed in the stepwise manner, the plasma output may be linearly changed. In addition, although the plasma output is changed by 100 W at every step, a smaller change in plasma output at every one-minute step, i.e., the greater number of steps, results in a continuous change in film density.

Next, a second layer is formed on the first layer. The second layer is formed by high frequency sputtering. For the sputtering, a sputtering device using, e.g., SiON, SiO$_2$, or Si$_3$N$_4$ as a target may be used. Then, e.g., Ar gas of about 10 cm$^3$/min and O$_2$ gas of about 5 cm$^3$/min are introduced into the sputtering device, and the sputtering is performed. As a result, a SiON film is formed. The SiON film is formed so as to have a thickness of, e.g., about 50 nm.

Subsequently, another first layer is formed on the second layer by the plasma CVD. At this point, the second layer is positioned below the first layer. Thus, after the plasma output is stepwisely changed from a higher level to a lower level, the plasma output is increased again, thereby continuously changing the film density. Specifically, after the plasma output is changed to about 1 kW and the film formation process is performed for about 2 minutes, the plasma output is decreased by about 100 W at every one-minute step. When the plasma output reaches about 200 W, the film formation process is performed for about 10 minutes in such a state. Then, the plasma output is increased by 100 W at every one-minute step again. When the plasma output reaches about 1 kW, the film formation process is performed for about 2 minutes in such a state. As this point, the first layer is formed. Note that conditions other than the way to change the plasma output are the same as those of the first layer which has been initially formed.

Next, in the similar manner as described regarding the second layer, another second layer is formed on the first layer.

The steps for forming the first layer and the second layer are repeated to form a moisture-proof part 12, followed by forming a moisture-proof film 10. Although it has been described that the formation of the first layer is first performed, the second layer may be first formed.

The moisture-proof film 10 can be used as, e.g., the support base 10 of the organic EL display device D described above. As the method for manufacturing the organic EL display device D, conventional well-known methods such as a roll-to-roll method can be employed other than the method using the moisture-proof film 10 of the present invention.

[Test and Evaluation]

Moisture-proof films and a film according to an example and first to third comparative examples were prepared.

EXAMPLE

Figure 2:
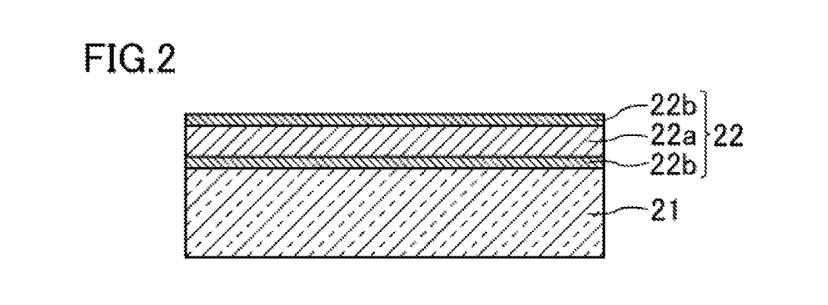
FIG. 2 is a cross-sectional view of a moisture-proof film of an example.

According to the method for manufacturing the moisture-proof film 10 in the present embodiment, a moisture-proof part 22 in which a second layer 22b, a first layer 22a, and a second layer 22b are stacked in this order was formed on a transparent polyimide film 21 (manufactured by Mitsubishi Gas Chemical Company, Inc., named "Neopulim," and having a heatproof temperature of equal to or higher than 150° C.), thereby forming a moisture-proof film of the example (see FIG. 2). Note that the first layer 22a of the example is made of SiONC having a carbon content distributed within a range of 0.1-5 mol %, and has a density distributed within a range of 2.4-2.6 g/cm³ and a thickness of 1 μm. In addition, each of the second layers 22b is made of SiON which does not contain carbon, and has a density of 3.1 g/cm³ and a thickness of 50 nm.

First Comparative Example

Figure 3:
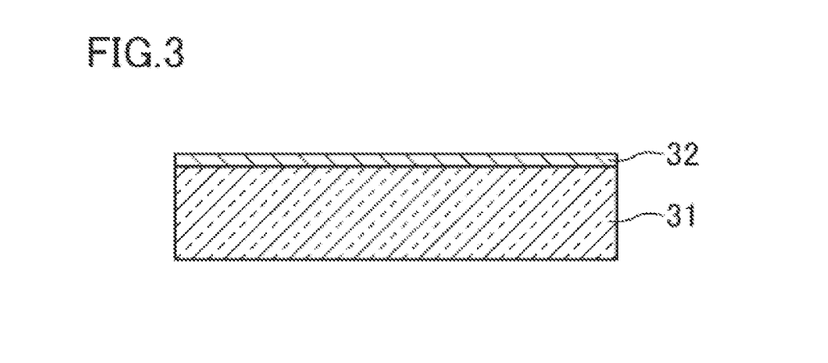
FIG. 3 is a cross-sectional view of a moisture-proof film of a first comparative example.

A SiON film 32 having a thickness of 50 nm and a density of 3.1 g/cm³ is formed on a film 31 made of polyethylene naphthalate and having a thickness of 0.1 mm, by RF sputtering. In such a manner, a moisture-proof film of a first comparative example is formed (see FIG. 3).

Second Comparative Example

Figure 4:
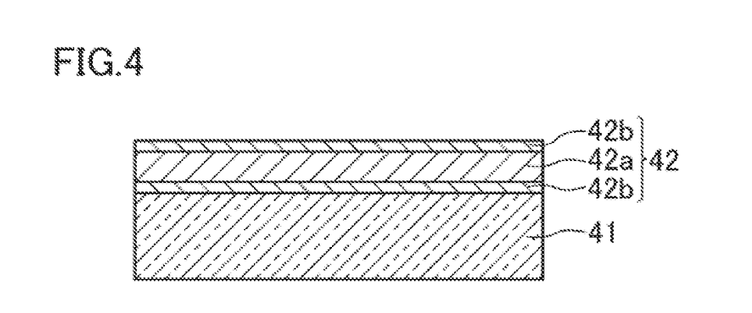
FIG. 4 is a cross-sectional view of a moisture-proof film of a second comparative example.

A SiON film 42b having a thickness of 50 nm and a density of 3.1 g/cm³ is formed on a film 41 made of the same polyethylene naphthalate as that of the first comparative example, by RF sputtering. Then, hexamethyldisilazane (HMDS) is used to form a SiONC film 42a having a thickness of 1 μm and a density of 2.6 g/cm³, by plasma CVD. Subsequently, another SiON film 42b having a thickness of 50 nm and a density of 3.1 g/cm³ is formed by the RF sputtering, thereby forming a moisture-proof film of a second comparative example. Note that, in the plasma CVD, plasma is generated at a uniform output intensity (see FIG. 4).

Third Comparative Example

Figure 5:
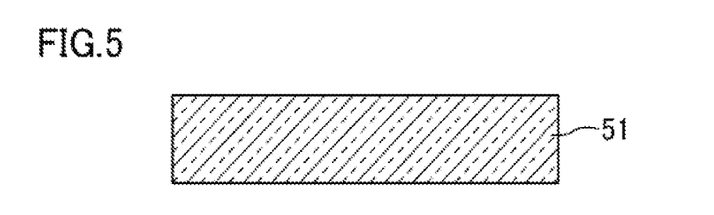
FIG. 5 is a cross-sectional view of a film of a third comparative example.

A film 51 made of the same polyethylene naphthalate as that of the first comparative example is used as a film of a third comparative example (see FIG. 5).

<Water Vapor Transmission Test (MOCON Method)>

For the moisture-proof films and the film of the first to third comparative examples, a visible light transmission rate, an oxygen transmission rate, and a water vapor transmission rate were measured. The water vapor transmission rate was measured according to JIS-K 7129 in atmosphere having a relative humidity of 90% at 40° C.

(Results)

Results of the water vapor transmission test are shown in Table 1.

TABLE 1

|  | First Comparative Example | Second Comparative Example | Third Comparative Example |
|---|---|---|---|
| Visible Light Transmission Rate (%) | 89.8 | 88.8 | 90.4 |
| Oxygen Transmission Rate (ml/m² · day · MPa) | 0.22 | 0.11 | 7.2 |
| Water Vapor Transmission Rate (g/m² · day) | 0.02 or Lower | 0.04 | 1.73 |

According to Table 1, the moisture-proof films of the first and second comparative examples each formed with the moisture-proof part exhibited higher barrier performance against oxygen and moisture as compared to the film of the third comparative example formed without a moisture-proof part.

In comparison between the moisture-proof film of the first comparative example formed with the moisture-proof part having the single layer and the moisture-proof film of the second comparative example formed with the moisture-proof part having the multiple layers, the moisture-proof film of the second comparative example exhibited higher barrier performance against both of oxygen and moisture. However, according to Table 1, the results of the oxygen transmission rate show that the moisture-proof film of the second comparative example exhibits higher barrier performance, whereas the results of the water vapor transmission rate show that the barrier performance of the moisture-proof film of the second comparative example is degraded.

This is because the moisture-proof part of the moisture-proof film of the second comparative example has the multiple layers and therefore moisture trapped at an interface between adjacent ones of the multiple layers permeates the moisture-proof film.

<Calcium Test>

Although, e.g., the water vapor transmission test (MOCON method) according to JIS-K 7129 has been known as a test for evaluating water vapor permeability, a calcium test described below is effective as a test for evaluating permeability to a slight amount of water vapor. The calcium test is a method by which, after reflectivity of a thin calcium film is measured, the amount of water vapor around the thin calcium film is calculated based on a relationship between a change in reflectivity and a calcium oxidation rate. A water vapor transmission rate (WVTR) was calculated for each of the water-proof films of the example and the second comparative example by performing the calcium test.

(Sample Preparation)

Figure 6:
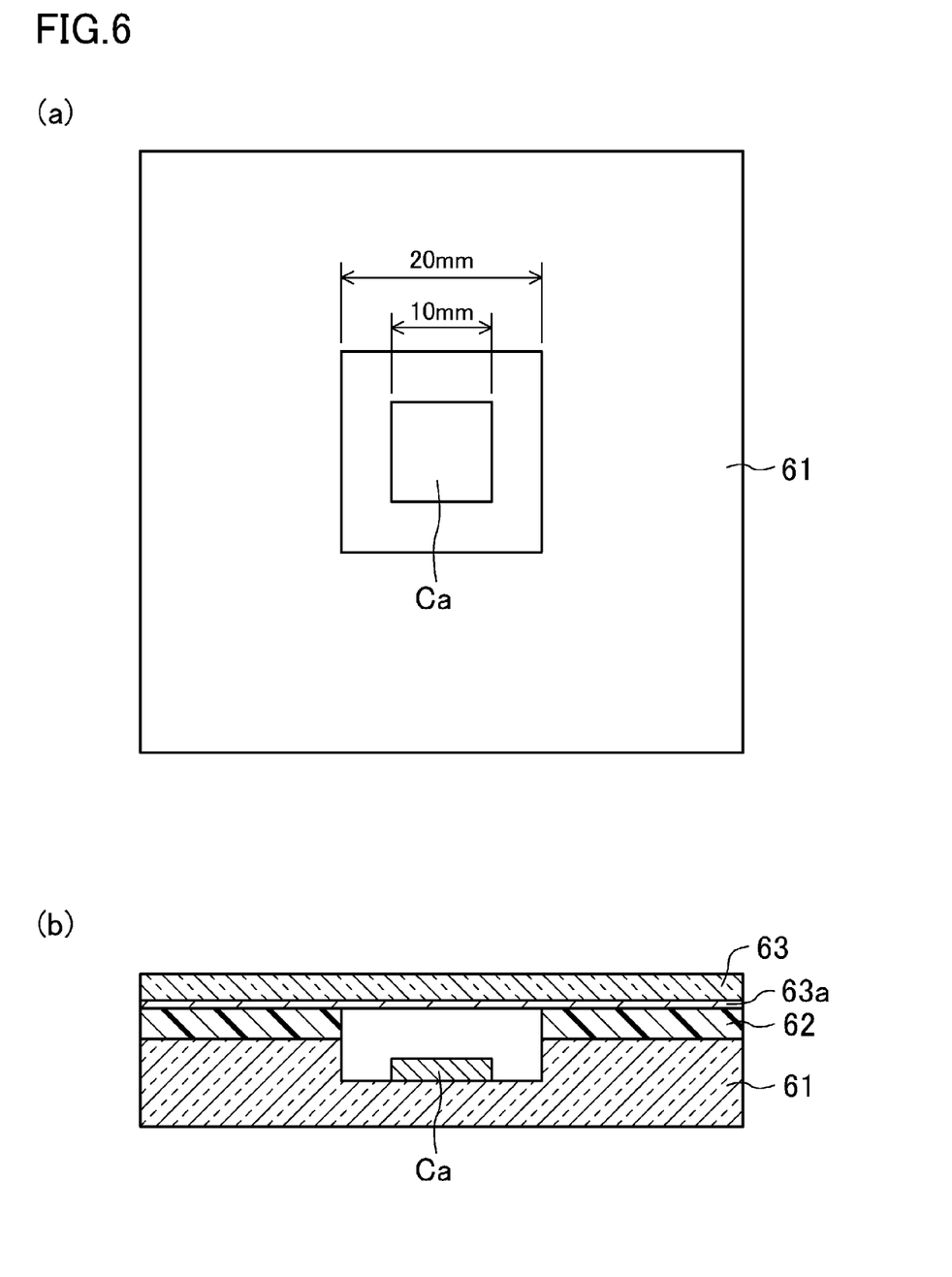
FIG. 6(a) is a plan view of a sample used for a calcium test.
FIG. 6(b) is a cross-sectional view of the sample used for the calcium test.

A sample used for the calcium test is illustrated in FIG. 6.

First, a notch formed in a rectangular parallelepiped shape of 20 mm on each side with a depth of 0.3 mm was provided in a center part of a glass substrate 61 (manufactured by Corning Incorporated, named "corning 1737 glass," and having a light transmittance of equal to or higher than 80% in a visible range ($\lambda$=450-800 nm)) of 100 mm on each side with a thickness of 0.7 mm. Calcium was deposited on a square region of 100 mm on each side in a center part of the notch by vacuum deposition.

Subsequently, epoxy resin 62 was applied to a thickness of 50 μm in a circumferential part of the glass substrate 61, and a moisture-proof part 63 which is a target to be measured was adhered to the epoxy resin 62 such that a water-proof part 63a faces the thin calcium film.

The sample was prepared in atmosphere having a low moisture concentration and a low oxygen concentration (both of the concentrations are equal to or lower than 10 ppm).

As reference data, measurement was also performed for a film for which a water vapor transmission rate was already obtained and which was formed without a moisture-proof part.

(Measurement Method)

Each of the samples for the calcium test was left in atmosphere, and the reflectivity of the thin calcium film was measured upon each elapse of a predetermined time. Note that the reflectivity of the thin calcium film was obtained as follows. Part of the sample was positioned under an optical microscope. A reflection image of such a part of the sample was used to measure reflectivity in a visible range ($\lambda$=450-700 nm) by using a spectrometer (MCPD-2000 manufactured by Otsuka Electronics Co., Ltd.), thereby calculating an average value. In such a manner, the reflectivity of the thin calcium film was obtained.

Next, the amount of moisture used for an oxidation reaction was calculated from an equation $Ca+2H_2O \rightarrow Ca(OH)_2 + H_2$ representing the oxidation reaction of calcium, supposing that the amount of decrease in reflectivity is equivalent to the amount of oxidized calcium. The amount of moisture which passes through the epoxy resin having a predetermined area and a predetermined thickness (50 μm in this measurement) from an end part of the sample and which enters the notch is already obtained. Thus, the amount of moisture used for the oxidation reaction was subtracted from the amount of moisture entering the notch through the epoxy resin, thereby calculating the amount of moisture entering the notch through the moisture-proof film.

Finally, the water vapor transmission rate of each of the moisture-proof films of the example and the second comparative example was calculated from the amount of moisture entering the notch through the moisture-proof film considering a relationship between a measurement result and the water vapor transmission rate in the reference data.

(Results)

Results, i.e., the water vapor transmission rates, are shown in Table 2.

TABLE 2

| | Example | Second Comparative Example | Reference Data |
|---|---|---|---|
| Film Opening Area (cm$^2$) | 4.0 | 4.0 | 4.0 |
| Water Vapor Transmission Rate WVTR (g/m$^2$ · day) | $6.72 \times 10^{-3}$ | $3.59 \times 10^{-2}$ | 2.01 |

According to Table 2, the water vapor transmission rate of the example is about 0.007 g/m$^2$·day, whereas the water vapor transmission rate of the second comparative example is about 0.036 g/m$^2$·day. The results show that excellent moisture-proof performance was exhibited in the moisture-proof film of the example including the moisture-proof part in which the first layer of the moisture-proof part has the density increasing toward the second layer.

<Brightness Test>

A test for evaluating brightness of light emitted from each of organic EL elements respectively including the moisture-proof films of the example and the second comparative example was performed.

(Sample Preparation)

Each of the moisture-proof films of the example and the second comparative example was used to form the organic EL element. A configuration of the organic EL element is as follows.

First, an IZO film (thickness of 150 nm) was formed on the moisture-proof film as a first electrode. Then, an α-NPD film (thickness of 50 nm), an Alq3 film (thickness of 50 nm), and an LiF film (thickness of 5 nm) were stacked in this order as organic layers. Finally, an Al film (thickness of 200 nm) was formed as a second electrode. In atmosphere in which each of an oxygen concentration and a moisture concentration was controlled to equal to or lower than 10 ppm, the foregoing films were sealed in glass substrates by using epoxy resin as an adhesive. In such a manner, a sample of the organic EL element was formed.

(Measurement Method)

For the organic EL elements respectively including the moisture-proof films of the example and the second comparative example, the brightness of light emitted when a predetermined magnitude of voltage is applied was measured at a room temperature (25° C.) and a relative humidity of 50%. In addition, the measurement was also performed after a predetermined period of time was elapsed from a start of light emission from the organic EL element.

(Results)

Figure 7:
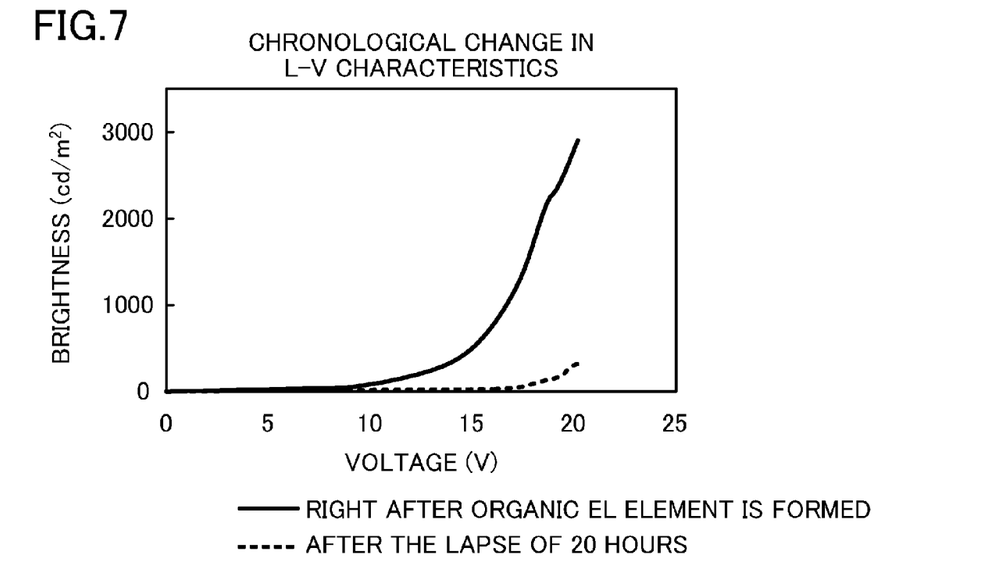
FIG. 7 is a graph illustrating a change in brightness of an organic EL element including the moisture-proof film of the example in a brightness test.
Figure 8:
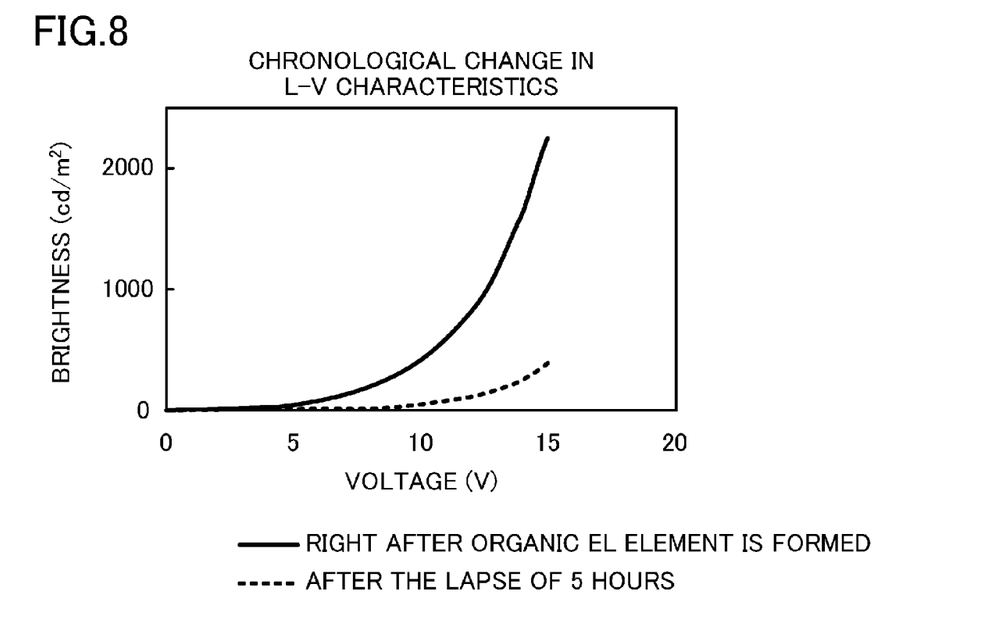
FIG. 8 is a graph illustrating a change in brightness of an organic EL element including the moisture-proof film of the second comparative example in the brightness test.

Results of the measurement are shown in FIGS. 7 and 8. In addition, the rate of change in brightness in accordance with the elapsed time when the predetermined voltage (20 V in the example and 15 V in the second comparative example) is illustrated in FIG. 9.

Figure 9:
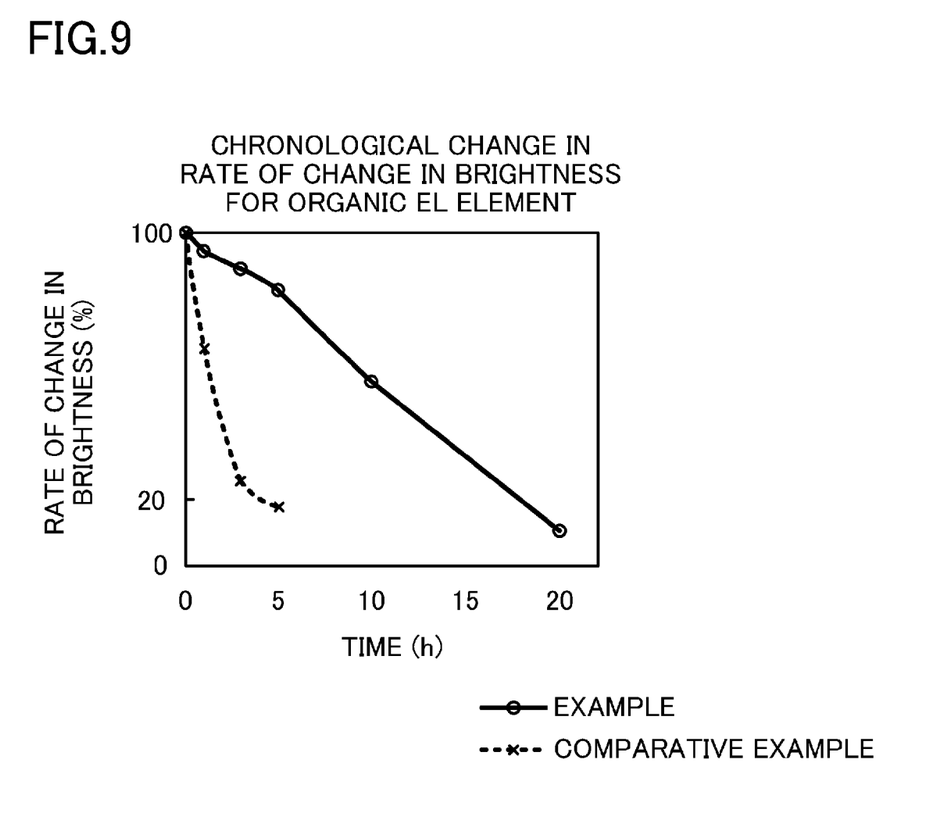
FIG. 9 is a graph illustrating the rate of change in brightness of the organic EL element in accordance with elapsed time.

According to FIGS. 7-9, the organic EL element including the moisture-proof film of the example has equal to or greater than 80% of brightness at the start of light emission even after the lapse of 5 hours from the start of light emission. On the other hand, the organic EL element including the moisture-proof film of the second comparative example has equal to or less than 20% of the brightness at the start of light emission after the lapse of 5 hours from the start of light emission. This shows that an organic EL element including a moisture-proof film having excellent moisture-proof properties exhibits excellent light emitting properties.

INDUSTRIAL APPLICABILITY

The present invention is useful for the moisture-proof film having excellent moisture-proof properties, the method for manufacturing the moisture-proof film, and the organic electronic device including the moisture-proof film.

| DESCRIPTION OF REFERENCE CHARACTERS | |
|---|---|
| D | Organic EL Display Device (Organic Electronic Device) |
| 10 | Moisture-Proof Film (Support Base) |
| 11 | Film Body |
| 12 | Moisture-Proof Part |
| 13 | First Electrode |
| 14 | Organic Layer |
| 15 | Second Electrode |

The invention claimed is:

1. A moisture-proof film, comprising:
a film body; and
a moisture-proof part formed on a surface of the film body, wherein the moisture-proof part includes
 a first layer made of a silicon oxycarbonitride compound containing carbon atoms in a composition thereof, and
 a second layer made of a silicon oxynitride compound which, in a composition thereof, contains carbon atoms less than those of the first layer or does not contain carbon atoms, and having a density higher than that of the first layer,
the first and second layers are stacked adjoining each other, and
the first layer has a density increasing toward the second layer.

2. The moisture-proof film of claim 1, wherein
the composition of the first layer is represented by SiONC, and
the composition of the second layer is represented by SiON.

3. The moisture-proof film of claim 1, wherein
the moisture-proof part is formed by alternately stacking the first and second layers.

4. The moisture-proof film of claim 1, wherein the second layer defines an outermost surface of the moisture-proof part on a side closer to the film body.

5. The moisture-proof film of claim 1, wherein the second layer defines an outermost surface of the moisture-proof part on a side opposite to the film body.

6. The moisture-proof film of claim 1, wherein the moisture-proof part has a thickness of 1-50 μm.

7. The moisture-proof film of claim 1, wherein the first layer has a thickness of 0.5-50 μm.

8. The moisture-proof film of claim 1, wherein the second layer has a thickness of 10-500 nm.

9. The moisture-proof film of claim 1, wherein the first layer has a carbon content of 1-30 mol % measured by electron spectroscopy.

10. The moisture-proof film of claim 1, wherein the second layer has a carbon content of 0-1 mol % measured by electron spectroscopy.

11. The moisture-proof film of claim 1, wherein the first layer has a density distribution falling within a range of 2.3-3.0 g/cm$^3$.

12. The moisture-proof film of claim 1, wherein the second layer has a density of 2.8-3.1 g/cm$^3$.

13. An organic electronic device, comprising:
the moisture-proof film of claim 1; and
an organic layer provided on the moisture-proof part of the moisture-proof film and provided so as to be sandwiched between two electrodes.

14. An organic electroluminescence device, wherein the organic layer of the organic electronic device of claim 13 is an organic electroluminescence layer.

15. A method for manufacturing a moisture-proof film including a film body and a moisture-proof part formed on a surface of the film body, the moisture-proof part having a first layer made of a silicon oxycarbonitride compound containing carbon atoms in a composition thereof, and a second layer made of a silicon oxynitride compound which, in a composition thereof, contains carbon atoms less than those of the first layer or does not contain carbon atoms and having a density higher than that of the first layer, the method comprising the steps of:
 forming the first layer by using plasma chemical vapor deposition; and
 forming the second layer by using sputtering,
 wherein, in the forming the first layer, plasma irradiation intensity is stepwise changed for forming part of the first layer closer to the second layer, thereby forming the first layer such that a density of the first layer is increased toward the second layer.

* * * * *